(12) United States Patent
Michiaki

(10) Patent No.: US 11,855,525 B2
(45) Date of Patent: Dec. 26, 2023

(54) CONNECTION STRUCTURE OF SNUBBER CIRCUIT WITHIN SEMICONDUCTOR DEVICE AND POWER MODULE STRUCTURE USING SAME

(71) Applicants: Hyundai Motor Company, Seoul (KR); Kia Motors Corporation, Seoul (KR)

(72) Inventor: Hiyoshi Michiaki, Kanagawa (JP)

(73) Assignees: Hyundai Motor Company, Seoul (KR); Kia Motors Corporation, Seoul (KR)

(*) Notice: Subject to any disclaimer, the term of this patent is extended or adjusted under 35 U.S.C. 154(b) by 352 days.

(21) Appl. No.: 17/129,236

(22) Filed: Dec. 21, 2020

(65) Prior Publication Data

US 2021/0359592 A1 Nov. 18, 2021

(30) Foreign Application Priority Data

May 18, 2020 (JP) .................................. 2020-86900

(51) Int. Cl.
*H02M 1/34* (2007.01)
*H01L 25/16* (2023.01)
(Continued)

(52) U.S. Cl.
CPC ........ *H02M 1/34* (2013.01); *H01L 23/49838* (2013.01); *H01L 25/16* (2013.01);
(Continued)

(58) Field of Classification Search
CPC ........ H02M 1/34; H02M 7/003; H02M 1/346; H02M 3/003; H01L 23/49838;
(Continued)

(56) References Cited

U.S. PATENT DOCUMENTS 10,418,895 B2* 9/2019 Otake .................... H02M 7/003
2014/0334203 A1* 11/2014 Honda .................. H02M 7/537
363/56.12

(Continued)

FOREIGN PATENT DOCUMENTS

JP 2013-222950 A 10/2013
JP 2016-225365 A 12/2016
(Continued)

*Primary Examiner* — S M Sohel Imtiaz
(74) *Attorney, Agent, or Firm* — Fox Rothschild LLP

(57) ABSTRACT

A connection structure of a snubber circuit within a semiconductor device includes: a first substrate having a first electrode wiring line; a second substrate facing the first substrate, the second substrate having a second electrode wiring line facing the first electrode wiring line; and a stack ceramic capacitor having connection terminals provided on opposite ends, respectively, of the stack ceramic capacitor installed in an upright position in such a manner that entire surfaces of the connection terminals are connected to the first and second electrode wiring lines, respectively, where the stack ceramic capacitor is installed adjacent to a switching element attached on the first substrate, and the connection terminal and one electrode terminal on the switching element are connected with the first electrode wiring line interposed therebetween.

4 Claims, 4 Drawing Sheets

(51) Int. Cl.
    *H01L 49/02*     (2006.01)
    *H02M 7/00*     (2006.01)
    *H01L 23/498*     (2006.01)
    *H02M 7/537*     (2006.01)

(52) U.S. Cl.
    CPC ............ *H01L 28/40* (2013.01); *H02M 7/003* (2013.01); *H02M 1/346* (2021.05); *H02M 7/537* (2013.01)

(58) Field of Classification Search
    CPC ....... H01L 25/16; H01L 28/40; H01L 25/072; H01L 25/18; H01L 23/3735; H01L 23/5385
    See application file for complete search history.

(56) References Cited

U.S. PATENT DOCUMENTS

| | | | |
|---|---|---|---|
| 2016/0344279 A1* | 11/2016 | Kanda | H02H 7/1225 |
| 2021/0143147 A1* | 5/2021 | Nakano | H01L 22/20 |
| 2021/0225753 A1* | 7/2021 | Hong | H05K 1/0204 |

FOREIGN PATENT DOCUMENTS

| | | | |
|---|---|---|---|
| JP | 2018-056221 A | | 4/2018 |
| JP | 2019-017112 A | | 1/2019 |
| JP | 2019-186983 A | | 10/2019 |
| JP | 2019186983 A | * | 10/2019 |
| JP | 2020-004929 A | | 1/2020 |

\* cited by examiner

CONNECTION STRUCTURE OF SNUBBER CIRCUIT WITHIN SEMICONDUCTOR DEVICE AND POWER MODULE STRUCTURE USING SAME

CROSS REFERENCE TO RELATED APPLICATION

The present application claims under 35 U.S.C. § 119(a) the benefit of Japanese Patent Application No. 2020-86900, filed May 18, 2020, the entire contents of which are incorporated by reference herein.

BACKGROUND

(a) Technical Field

The present disclosure relates to a connection structure of a snubber circuit within a semiconductor device and a power module structure using the connection structure, more particularly, to the snubber circuit in which a stack ceramic capacitor constituting the snubber circuit is arranged in an upright position for connection between two substrates facing each other.

(b) Description of the Related Art

Power modules, each of which is equipped with a power semiconductor controlling electric power supplied to various electric devices, have been widely used. The power modules vary by type of use according to different applications. The power modules provided in vehicles can be used for switching comparatively high current at a high speed.

In most cases, silicon (Si)-based power semiconductors have been used in the related art. However, next-generation power semiconductors, of which a SiC Metal Oxide Semiconductor Field Effect Transistor (MOSFET) is typical, are now finding application in power modules. The SiC MOSFET has a lower electric power loss than a Si insulated-gate bipolar transistor (IGBT). The SiC MOSFET, although decreased in chip size, has the same performance as the SI IGBT. The SiC MOSFET is expected to contribute to greatly improving performance of power conversion devices, such as power control units (PCU) to be mounted on vehicles, as well as to realizing high-speed switching.

However, high-speed switching exerts an influence on a wiring line constituting a circuit, an induction coefficient of an electronic component or the like, or a parasitic capacitance between wiring lines. Thus, a surge voltage occurs or noise, such as linking, occurs. As switching is performed at a higher speed, this noise is further increased. This problem must be solved in order to achieve an improvement in performance through an increase in speed.

One of the methods of reducing noise when performing switching at a high speed is to employ a snubber circuit. The snubber circuit is a circuit having a structure in which a capacitor (or a capacitor and a resistor that are serially arranged) is provided in parallel with a power semiconductor.

In order for the snubber circuit to perform effectively, there is a need to connect the snubber circuit immediately adjacent to the power semiconductor, and it is desirable that the snubber circuit is provided within a power module. High heat resistance and high reliability are required of the capacitor used in the snubber circuit. Stack ceramic capacitors, which are relatively inexpensive and typically have high resistance and the high reliability, have been proposed.

However, because normal stack ceramic capacitors are flat surface-mounted, a planar mounting area is predetermined in a normal arrangement, thereby imposing a limitation on miniaturization of the power module. In addition, the use of the normal stack ceramic capacitors in a situation where a mounting substrate is easily warped decreases the reliability of a connection portion.

Japanese Patent Application Publication No. 2019-186983 discloses a semiconductor power module in which a thin-filmed snubber capacitor to be connected in parallel to a semiconductor switching element is provided in the vicinity of a semiconductor switching element, and which may reduce the noise due to linking even when performing a high-speed switching operation.

According to Japanese Patent Application Publication No. 2019-186983, because the thin-filmed snubber capacitor can be provided at a distance of 10 μm away from the semiconductor switching element, it is possible to sufficiently reduce the noise due to linking. However, in order to obtain a necessary capacity, there is a need to precisely control an area and a thickness of a thin film. Therefore, a major disadvantage with this method is that the operating cost of performing a thin film process is very high. Furthermore, an increase in the capacity increases a required exclusive area, thereby increasing a size of the module.

For this reason, there is a need to provide a connection structure of a snubber circuit within a semiconductor device, which has a small size and is capable of performing a high-speed switching operation, and a power module structure using this connection structure.

The foregoing is intended merely to aid in the understanding of the background of the present disclosure, and is not intended to mean that the present disclosure falls within the purview of the related art that is already known to those skilled in the art.

SUMMARY

The present disclosure provides a connection structure of a snubber circuit within a semiconductor device, in which a stack ceramic capacitor constituting the snubber circuit is arranged in an upright position for connection between two substrates facing each other, and a power module structure using the connection structure of the snubber circuit within the semiconductor device. The connection structure according to the present disclosure can be produced at a low operating cost. Furthermore, the connection structure has a small size and high reliability, while providing effective noise reduction.

According to an aspect of the present disclosure, there is provided a connection structure of a snubber circuit within a semiconductor device, for use in a power module, the connection structure including: a first substrate having a first electrode wiring line provided on at least one surface of the first substrate; a second substrate facing the first substrate, the second substrate having a second electrode wiring line being provided on at least one surface of the second substrate facing the first electrode wiring line; and a stack ceramic capacitor having first and second connection terminals provided on opposite ends in a longitudinal direction, respectively, of the stack ceramic capacitor that is installed in an upright position in such a manner that an entire surface of the first connection terminal on a first end thereof is connected to the first electrode wiring line and an entire surface of the second connection terminal on a second end thereof is connected to the second electrode wiring line, wherein the stack ceramic capacitor is installed adjacent to a switching element of a power module, the switching element being mounted on the first substrate, and wherein the first connection terminal and one electrode terminal on the switching element are connected to each other, and the first electrode wiring line interposed therebetween.

In the connection structure, the stack ceramic capacitor may include a plurality of stack ceramic capacitors in the upright position and may be connected in parallel to each other between the first electrode wiring line and the second electrode line.

In the connection structure, the stack ceramic capacitor may include a plurality of stack ceramic capacitors in the upright position between the first substrate and the second substrate in such a manner that a plurality of structures in which the stack ceramic capacitors are connected in parallel to each other are serially connected to each other.

According to another aspect of the present disclosure, there is provided a power module structure including: a first substrate, having a first electrode wiring line provided on at least one surface of the first substrate; a second substrate facing the first substrate, the second substrate having at least a second electrode wiring line provided on at least one surface of the second substrate facing the first electrode wiring line; at least one switching element mounted on the first substrate; a spacer inserted between an electrode terminal on an upper surface of the at least one switching element and the second substrate and configured to electrically connect the electrode terminal on the upper surface thereof and the second electrode wiring line on the second substrate or another electrode wiring line on the second substrate to each other; and a stack ceramic capacitor having first and second connection terminals provided on opposite ends in a longitudinal direction, respectively, of the stack ceramic capacitor that is installed in an upright position in such a manner that an entire surface of the connection terminal on a first end thereof is connected to the first electrode wiring line and an entire surface of the connection terminal on a second end thereof is connected to the second electrode wiring line, wherein the stack ceramic capacitor is installed adjacent to the at least one switching element and configured as a snubber circuit in which the first connection terminal on at least the first end thereof and an electrode terminal on a lower surface of the switching element are connected to each other with the first electrode wiring line interposed therebetween.

In the connection structure of a snubber circuit within a semiconductor device according to the present disclosure, it is possible to install the stack ceramic capacitor, which is relatively inexpensive and easy to ensure high heat dissipation and high reliability, in the upright position in the vicinity of the switching element. Therefore, the snubber circuit can be realized at a low cost, a mounting area of the capacitor can be minimized, and the effect of sufficiently reducing noise in a high-speed switching operation can also be expected.

In addition, in connection structure of a snubber circuit within a semiconductor device according to the present disclosure, the stack ceramic capacitor is mounted in the upright position with respect to the mounting substrate, and entire surfaces of the connector terminal on the stack ceramic capacitor are used for connection. Because of this, stable and high-reliability connection is possible. With additional connection of the stack ceramic capacitor in the upright position, structural stress applied to the stack ceramic capacitors is primarily made up of compressive and tensile stresses. Therefore, it is difficult for the same warping stress as in normal flat surface-mounting to occur on a connection portion, and it is possible to prevent a crack from occurring in a connection portion of the stack ceramic capacitor due to the warping stress. For this reason, a metal terminal alleviating a stress due to the mounting does not need to be separately provided on the stack ceramic capacitor. This provides the advantage of lowering manufacturing cost. In the power module structure using the connection structure of a snubber circuit within a semiconductor device according to the present disclosure, a distance between the first substrate and the second substrate is determined according to a dimension, in a longitudinal direction, of the stack ceramic capacitor. Therefore, in addition to the spacer on the switching element, which is inserted in a manner that corresponds to the dimension of the stack ceramic capacitor, there is no need to provide a separate spacer for the capacitor. In addition, surfaces, exposed to the outside, of the first substrate and the second substrate can be used for cooling. Therefore, it is possible to use the power module structure appropriately as a double-sided cooling-type module.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Throughout the specification, unless explicitly described to the contrary, the word "comprise" and variations such as "comprises" or "comprising" will be understood to imply the inclusion of stated elements but not the exclusion of any other elements. In addition, the terms "unit", "-er", "-or", and "module" described in the specification mean units for processing at least one function and operation, and can be implemented by hardware components or software components and combinations thereof.

Further, the control logic of the present disclosure may be embodied as non-transitory computer readable media on a computer readable medium containing executable program instructions executed by a processor, controller or the like. Examples of computer readable media include, but are not limited to, ROM, RAM, compact disc (CD)-ROMs, magnetic tapes, floppy disks, flash drives, smart cards and optical data storage devices. The computer readable medium can also be distributed in network coupled computer systems so that the computer readable media is stored and executed in a distributed fashion, e.g., by a telematics server or a Controller Area Network (CAN).

A connection structure of a snubber circuit within a semiconductor device and a power module structure using the connection structure of the snubber circuit within the semiconductor device according to embodiments of the present disclosure will be described in detail below with reference to the drawings.

Figure 1:
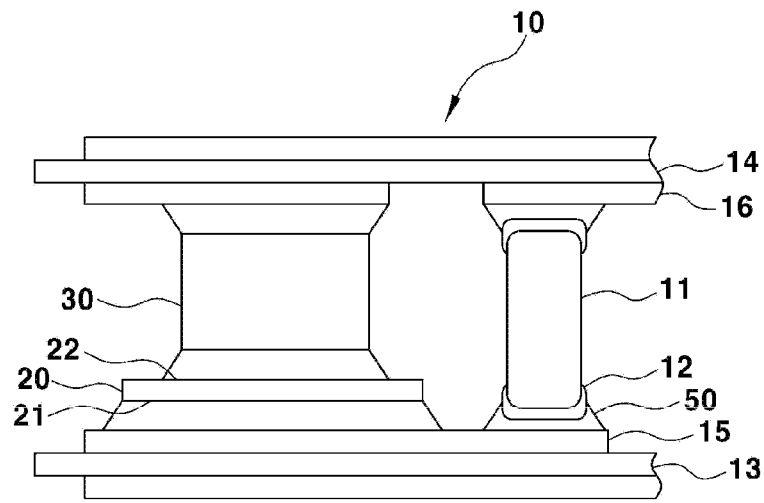
FIG. 1 is a view schematically illustrating a connection structure of a snubber circuit within a semiconductor device according to an embodiment of the present disclosure.

FIG. 1 is a view schematically illustrating a connection structure of a snubber circuit within a semiconductor device according to an embodiment of the present disclosure. The connection structure of a snubber circuit within a semiconductor device according to the present disclosure is a small-sized circuit structure that is used for a power module and is effective in reducing noise.

The power module, such as an inverter circuit converting direct current into alternating current, is used for power control. For the power control, a switching element assembled into the power module performs switching. When the switching is performed, output current varies greatly. Accordingly, a power voltage easily changes due to an influence of an inductance coefficient, parasite capacitance, or the like of a circuit. Therefore, generally, in order to suppress this change in electric power, large-capacity capacitors are installed in series to a direct-current power source.

However, when a distance from the high-capacity capacitor to the switching element is great, the effect of suppressing the change in electric power cannot be sufficiently achieved without suppressing an influence of the inductance coefficient or the like of a wiring line connecting the high-capacity capacitor and the switching element to each other. A snubber circuit is a circuit capable of achieving the effect of reducing all noise that cannot be removed in the high-capacity capacitors installed in parallel to be connected to the direct-current power source. Types of the snubber circuits include a C snubber circuit, an RC snubber circuit, an RCD snubber circuit, and the like. In the C snubber circuit, a capacitor is installed in parallel with respect to a circuit that to is serially connected to the switching element. In the RC snubber circuit, a circuit that is serially connected to a capacitor or a resistor is installed in parallel with respect to the switching element. In the RCD snubber circuit, a circuit that is connected in parallel to a diode and a resistor and then is serially connected to a capacitor is installed in parallel with respect to the switching element or a circuit that is serially connected to the switching element. A capacitor is an integral constituent element in any snubber circuit. Unlike in a method in which a capacitor is used in a planar manner through normal surface mounting, in the connection structure of a snubber circuit within a semiconductor device according to the present disclosure, the capacitor is installed in the upright position with respect to a substrate. A feature of the connection structure according to the present disclosure is that the capacitor is installed in a small installation area in the vicinity of (e.g., adjacent to) the switching element.

With reference to FIG. 1, a connection structure 10 of a snubber circuit within a semiconductor device according to an embodiment of the present disclosure includes a first substrate 13, a second substrate 14, and a stack ceramic capacitor 11. A first electrode wiring line 15 is provided on one surface of the first substrate 13. A second electrode wiring line 16 is provided on a surface, facing the first electrode wiring line 15, of the second substrate 14. The stack ceramic capacitor 11 is installed in an upright position with respect to the first substrate 13 and the second substrate 14 in such a manner as to be electrically connected to the first electrode wiring line 15 and the second electrode wiring line 16 facing each other.

Connection terminals 12 are provided on opposite ends in a longitudinal direction, respectively, of the stack ceramic capacitor 11. The stack ceramic capacitor 11 is installed in the upright position. Thus, an entire surface of one connection terminal (e.g., a first connection terminal) 12 and an entire surface of the other (e.g., a second) connection terminal 12 are used for connection. That is, the entire surface of the connection terminal 12 on a first end of the multiplayer ceramic capacitor 11 is connected to the first electrode wiring line 15, and the entire surface of the connection terminal on the second end thereof is connected to the second electrode wiring line 16. The connection terminals are bonded to the electrode wiring lines 15 and 16, respectively, with a conductive bonding material 50 interposed therebetween.

Generally, a soldering material or the like is used as the conductive bonding material 50. However, any conductive material may be used as the conductive bonding material 50. In addition, the same conductive bonding material 50 may be used to bond the connection terminal 12 to the electrode wiring lines 15 and 16, respectively. The conductive bonding material 50 may include a plurality of types of the conductive bonding material 50, where the types of the conductive bonding materials 50 may be changed according to types of the electrode wiring lines 15 and 16 to which the conductive bonding materials 50, respectively, are connected. For example, a circuit, such as the RC snubber circuit, may utilize the conductive bonding material 50 including a resistor.

The stack ceramic capacitor 11 is installed in the vicinity of a switching element 20 of the power module, which is mounted on the first substrate 13. The stack ceramic capacitor 11 shares the first electrode wiring line 15 with the switching element 20. That is, an electrode 21 on a lower surface of the switching element 20 and the connection terminal 12 on a lower end of the stack ceramic capacitor 11 are electrically connected to each other with the first electrode wiring line 15 interposed therebetween. The sharing of the first electrode wiring line 15 by the stack ceramic capacitor 11 with the switching element 20 makes it possible for the stack ceramic capacitor 11 to be installed in the vicinity of the switching element 20.

The conductive bonding material 50 is used to electrically connect the electrode 21 on the lower surface of the switching element 20 and the first electrode wiring line 15 when the switching element 20 is attached on the first substrate 13. However, the conductive bonding material 50 bonding a lower end portion of the stack ceramic capacitor 11 and the conductive bonding material 50 bonding the electrode 21 on the lower surface of the switching element 20 may be brought into contact with each other or may be partially combined with each other in an integral manner.

An electrode 22 on an upper surface of the switching element 20 is connected to an electrode wiring line on the second substrate 14 with a conductive spacer 30 interposed therebetween. The electrode 22 on the upper surface of the switching element 20 and the conductive spacer 30 are connected to each other with the conductive bonding material 50 interposed therebetween. The conductive spacer 30 and the electrode wiring line on the second substrate 14 are connected to each other with the conductive bonding material 50 interposed therebetween.

When used as the C snubber circuit, the stack ceramic capacitor 11 is connected in parallel with respect to the switching element 20 that is serially connected. Therefore, unlike the second electrode wiring line 16 to which an upper end of the stack ceramic capacitor 11 is connected, the electrode wiring line on the second substrate 14, to which the electrode 22 on the upper surface of the switching element 20 is connected, is an electrode wiring line for connection to another switching element 20 that is serially connected. The power module structure as configured above will be described below with reference to FIGS. 4A to 4D.

For example, when the stack ceramic capacitor 11, as described above, is connected to the second electrode wiring line 16 with a resistor interposed therebetween, the electrode wiring line on the second substrate 14, to which the electrode 22 on the upper surface of the switching element 20 is connected, may be the second electrode wiring line 16.

The conductive spacer 30 not only electrically connects the electrode 22 on the upper surface of the switching element 20 and the electrode wiring line on the second substrate 14 to each other, but also serves as a thermally conductive body that transfers heat generated in the switching element 20 to the second substrate 14. Therefore, it is desirable that the spacer 30 is made of copper, a copper alloy, or the like that has low resistivity and excellent thermal conductivity. A structure as illustrated in FIG. 1 is employed to transfer the heat generated in the switching element 20 to the first substrate 13 and the second substrate 14. It is possible that the power module structure having the connection structure 10 of the snubber circuit within the semiconductor device is used as a double-sided heat dissipation power module in which a lower surface of the first substrate 13 and an upper surface of the second substrate 14 serve as heat dissipating surfaces.

The connection structure 10 of a snubber circuit within a semiconductor device according to the present disclosure has the structural feature that the stack ceramic capacitor 11 has to be mounted in the upright position. Thus, a distance between two substrates (i.e., the first substrate 13 and the second substrate 14) facing each other is determined by a length of the stack ceramic capacitor 11. Therefore, the conductive spacer 30 is formed to have a length that is determined considering a distance between the conductive spacer 30 and the electrode 22 on the upper surface of the switching element 20.

It is desirable that a capacity of the stack ceramic capacitor 11 is individually adjusted in such a manner that the stack ceramic capacitor 11 has the most efficient capacity for reducing noise, but it is not easy to manufacture the stack ceramic capacitor 11 so as to be attached to a circuit. In the connection structure 10 of a snubber circuit within a semiconductor device according to the embodiment of the present disclosure, a plurality of the stack ceramic capacitors 11 may also be easily in parallel or in the upright position as will be described below with reference to FIGS. 2 and 3. Thus, it is possible that a chip capacitor that is an inexpensive chip component commonly available is used as the stack ceramic capacitor 11.

Normally, for connection, both terminals on the chip component are soldered to two electrodes, respectively, that are mounted a distance away from each other on one mounting substrate. The mounting substrate is made up of a base material and a wiring material. Various electronic components are mounted on the mounting substrate. For these reasons, the mounting substrate is easily warped due to heat that is generated when a circuit operates. When the mounting substrate is warped, there is a concern that bending stress will be concentrated on soldered joint portions of both terminals of the chip component, thereby causing a crack or the like.

However, in the connection structure 10 of a snubber circuit within a semiconductor device according to the present disclosure, only one terminal on the stack ceramic capacitor 11 is connected to one mounting substrate. Therefore, even if the mounting substrate is warped, bending stress is unlikely to occur. Although not illustrated in FIG. 1, for the purpose of protecting the switching element 20, molding resin is put into a space between the first substrate 13 and the second substrate 14. Due to curing and shrinking of the molding resin, at room temperature, the same compression stress as is applied to the first and second substrates 13 and 14 is applied to a joint portion of the connection terminal 12 on the stack ceramic capacitor 11. In addition, although the connection structure 10 of the snubber circuit within the semiconductor device may reach a high temperature due to high current that results from a switching operation, tensile stress resulting from a difference in a thermal expansion coefficient between the stack ceramic capacitor 11 and the molding resin may occur on the joint portion, but great stress is not applied to the joint portion. Therefore, the connection structure 10 of a snubber circuit within a semiconductor device according to the present disclosure ensures a state of stable connection and has a high reliability of connection.

High heat resistance is required of the first and second substrates 13 and 14 because the power module generates a large amount of heat. In most cases, a resin substrate is used as a normal wiring substrate. However, it is desirable that the resin substrate for the power module is made of high heat resistance resin. Particularly, high reliability is required of the wiring line substrates that are used in vehicle components. According to the present embodiment, ceramic substrates are used as the first and second substrates 13 and 14. Types of ceramics include alumina ceramics, silicon nitride, and the like. Materials of the first and second substrates 13 and 14 are not limited to a specific type of ceramics.

It is desirable that the electrode wiring lines 15 and 16 formed on the first and second to substrates 13 and 14, respectively, are copper wiring lines having excellent thermal conductivity and small resistivity. However, the electrode wiring lines 15 and 16 may be made of any material that satisfies required electric characteristics.

Figure 2:
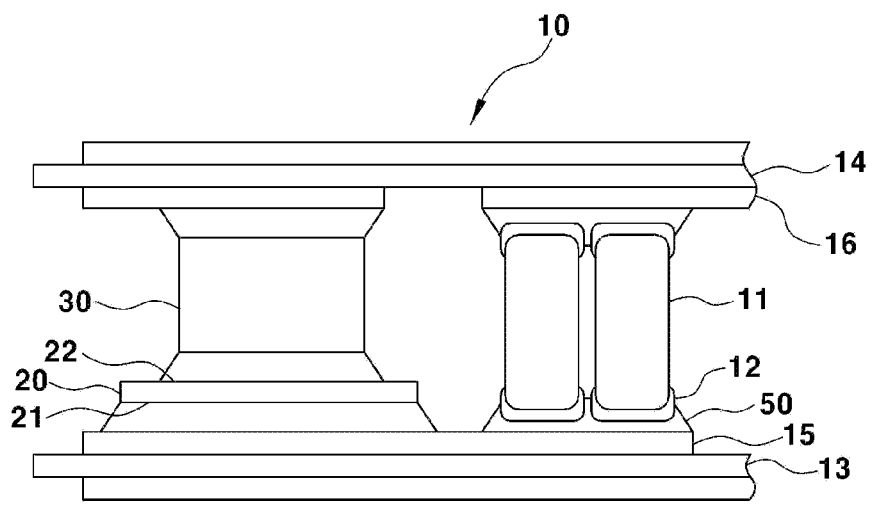
FIG. 2 is a view schematically illustrating the connection structure of a snubber circuit within a semiconductor device according to the embodiment of the present disclosure, in which stack ceramic capacitors are provided for parallel connection.

FIG. 2 is a view schematically illustrating the connection structure of a snubber circuit within a semiconductor device according to the embodiment of the present disclosure, in which stack ceramic capacitors are provided for parallel connection;

The connection structure of the snubber circuit within the semiconductor device in FIG. 2 has substantially the same fundamental configuration as the connection structure 10 of the snubber circuit within the semiconductor device in FIG. 1. That is, the connection structure of the snubber circuit within the semiconductor device in FIG. 2 has the same electrode wiring lines 15 and 16 for connection to the switching element 20 and the stack ceramic capacitor 11, respectively, as the connection structure 10 of the snubber circuit within the semiconductor device in FIG. 1. The difference is that the plurality of the stack ceramic capacitors 11 are connected in parallel in FIG. 2. Descriptions of configurations that are the same as those in FIG. 1 are omitted, and the parallel connection, which is a difference from FIG. 1, will be described below.

In the connection structure 10 of a snubber circuit within a semiconductor device according to an embodiment of the present disclosure, a chip capacitor, which is an inexpensive chip component, is used as the stack ceramic capacitor 11. Generally, outer diameters of chip components commonly available are standardized, and chip components that have the same size but have a different capacity are serialized. When a chip capacitor having a desired capacity is not a serialized chip component, it is also possible to secure a chip capacitor having approximately the desired capacity by combining commonly available serialized chip capacitors.

FIG. 2 illustrates a configuration in which two stack ceramic capacitors 11 are connected in parallel. The two stack ceramic capacitors 11 may have the same capacity or a different capacity. However, the two stack ceramic capacitors 11 having at least the same length in the external diameter size are used.

As described above, the distance between two substrates (i.e., the first substrate 13 and the second substrate 14) facing each other is determined according to the length of the stack ceramic capacitor 11. For this reason, if the stack ceramic capacitors 11 having different lengths are connected in parallel, the distance between the two substrates (i.e., the first substrate 13 and the second substrate 14) facing each other are restricted to the larger of the lengths of the stack ceramic capacitors 11. Thus, a component for adjusting a length, such as a spacer, is separately necessary for connection to the stack ceramic capacitor 11 having a smaller length.

An area necessary for mounting the two stack ceramic capacitors 11 that are to be connected in parallel is so small as to be at least two times an area of an end portion of the stack ceramic capacitor 11. This makes very compact mounting possible and prevents the power module from being increased to a size larger than is necessary. The conductive bonding material 50 prepared to mount the stack ceramic capacitor 11 may be shared between the two stack ceramic capacitors 11. For example, a reflow process is performed in a state where the two stack ceramic capacitors 11 are held in the upright position on soldering paste or soldering foil at one place. In this manner, the two stack ceramic capacitors 11 are attached at the same time.

FIG. 2 illustrates a case where the two stack ceramic capacitors 11 are connected in parallel. However, the number of the stack ceramic capacitors 11 is not limited to 2. Three or more stack ceramic capacitors 11 may be connected in parallel. In addition, a plurality of the stack ceramic capacitors 11 may be arranged in such a manner that they face each other, as illustrated in FIG. 2, and may be arranged side by side along a circumferential edge of the switching element 20 when viewed above. In either case, the entire surfaces of the connection terminal 12 on the stack ceramic capacitor 11 are connected to the electrode wiring lines, respectively, in the same manner as in FIG. 1.

Figure 3:
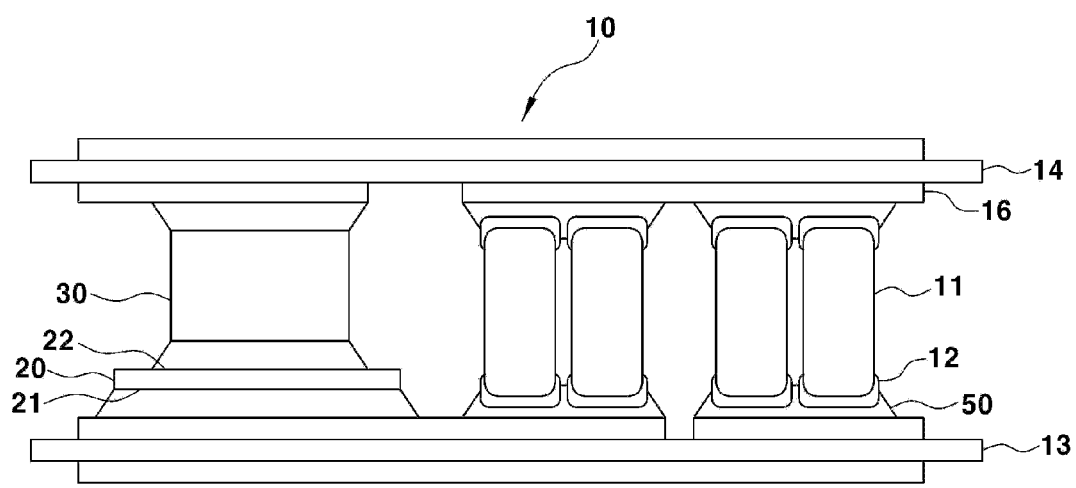
FIG. 3 is a view schematically illustrating the connection structure of a snubber circuit within a semiconductor device according to the embodiment of the present disclosure, in which the stack ceramic capacitors are provided for serial connection.

FIG. 3 is a view schematically illustrating the connection structure of a snubber circuit to within a semiconductor device according to the embodiment of the present disclosure, in which the stack ceramic capacitors 11 are provided for serial connection.

With reference to FIG. 3, in the connection structure 10 of the snubber circuit within the semiconductor device in FIG. 2, in which the stack ceramic capacitors 11 are provided for parallel connection, the stack ceramic capacitors 11 that are connected in parallel is additionally serially connected.

The switching element 20 and the stack ceramic capacitors 11 connected in parallel that are illustrated adjacent to the switching element 20 in FIG. 3 are described above with reference to FIGS. 1 and 2, and thus descriptions thereof are omitted.

The two stack ceramic capacitors 11 that are to be additionally serially connected are connected in parallel to each other. The connection terminals 12 on upper ends of the stack ceramic capacitors 11 are connected to the second electrode wiring line 16 on the second substrate 14, and the connection terminals 12 on lower ends of the stack ceramic capacitors 11 are both connected to an electrode wiring line different from the first electrode wiring line 15 on the first substrate 13. At this point, the connection electrodes 12 on the upper and lower ends of each of the two stack ceramic capacitors 11 that are to be serially connected are both connected to the first and second substrates 13 and 14, respectively, with the conductive bonding material 50 interposed therebetween, in the same manner as in FIGS. 1 and 2. Furthermore, the entire surfaces of the connection terminal 12 are used for connection in the same manner as in FIGS. 1 and 2.

Another switching element 20 (not illustrated) that is serially connected to the switching element 20 in FIG. 3 is connected to an electrode wiring line different from the first electrode wiring line 15 on the first substrate 13, to which the connection terminal 12 on the lower end of the stack ceramic capacitor 11 is connected. The serially connected switching element 20 and the snubber circuit in which two stack ceramic capacitors 11 connected in parallel are serially connected are configured to be connected in parallel.

FIGS. 4A to 4D are views each schematically illustrating a power module structure using the connection structure of a snubber circuit within a semiconductor device according to the embodiment of the present disclosure.

Figure 4A:
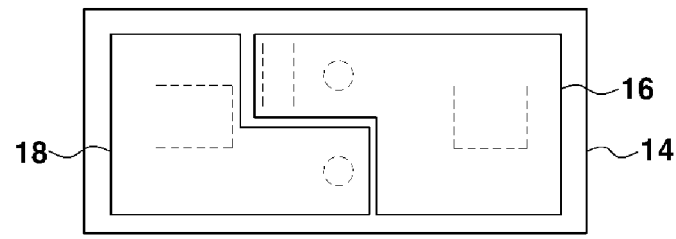
FIGS. 4A to 4D are views each schematically illustrating a power module structure using the connection structure of a snubber circuit within a semiconductor device according to the embodiment of the present disclosure.
Figure 4B:
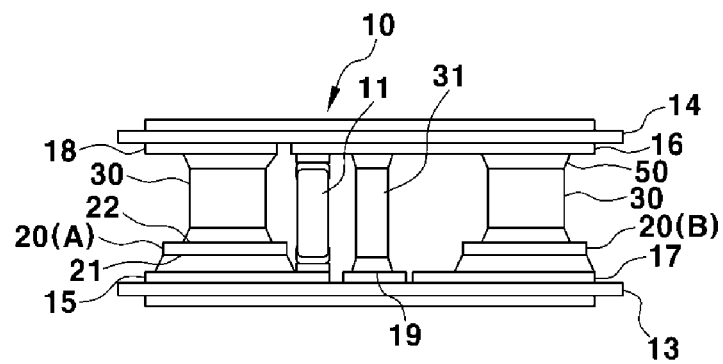
Figure 4C:
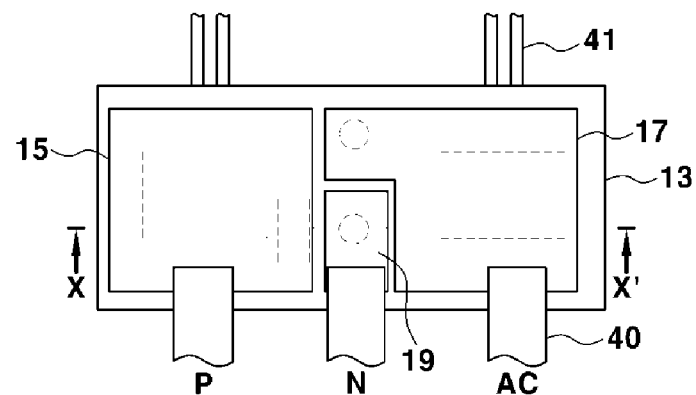
Figure 4D:
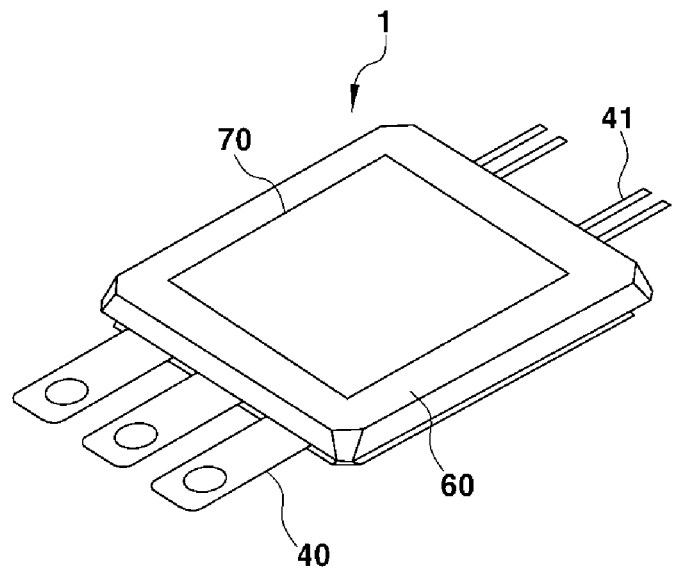

FIG. 4A is a view illustrating a surface of the second substrate 14 in a power module structure 1 using the connection structure 10 of a snubber circuit within a semiconductor device according to the embodiment of the present disclosure, when viewed from a direction of the stack ceramic capacitor 11. FIG. 4C is a top view illustrating the first substrate 13 in the power module structure 1 when viewed from the direction of the stack ceramic capacitor 11. FIC. 4B is a view taken along line X-X' on the power module structure 1 in FIG. 4C, when viewed from front. FIG. 4D is a perspective view illustrating the exterior appearance of the power module structure 1. With reference to FIGS. 4A to 4C, the power module structure 1 using the connection structure 10 of a snubber circuit within a semiconductor device according to the embodiment of the present disclosure includes the first substrate 13, the second substrate 14, at least one switching element 20A, the spacer 30, and the stack ceramic capacitor 11. The first electrode wiring line 15 is provided on a surface of the first substrate 13. The second electrode wiring line 16 is provided on a surface of the second substrate 14 facing the first electrode wiring line 15. At least one switching element is mounted on the first substrate 13. The spacer 30 is inserted between an electrode terminal 22 on an upper surface of at least one switching element 20A and the second substrate 14 and connects the electrode terminal 22 on the upper surface thereof and another electrode wiring line 18 on the second substrate 14 to each other. The connection terminals 12 are provided on opposite ends in the longitudinal direction, respectively, of the stack ceramic capacitor 11. The stack ceramic capacitor 11 is installed in the upright position in such a manner that entire surfaces of the connection terminal 12 are connected to the first electrode wiring line 15 and the second electrode wiring line 16, respectively.

The power module structure 1 illustrated in FIGS. 4A to 4D is the power module structure 1 employed for the inverter circuit. In addition to the switching element 20A connected to the first electrode wiring line 15 on the first substrate 13, the power module structure 1 includes a switching element 20B and two conductive via-spacers 31. The switching element 20B is serially connected to the switching element 20A. The two conductive via-spacers 31 are electrically connected to the electrode wiring line on the first substrate 13 and the electrode wiring line on the second substrate 14. The conductive via-spacer 31 is a columnar conductor. For example, the conductive via-spacer 31 is a circular metal material. It is desirable that the conductive via-spacer 31 is a conductor that has approximately a coefficient of thermal expansion, in the longitudinal direction, of the stack ceramic capacitor 11 connected in parallel.

A broken-line rectangular pattern on an electrode wiring line pattern in FIGS. 4A and 4C indicates a position in which the switching elements 20A and 20B are installed or a position in which the stack ceramic capacitor 11 is installed. A broken-line circular pattern indicates a position in which the via-spacer 31 is installed.

The order in which the switching elements 20A and 20B are connected are as follows. An electrode terminal 21 on the lower surface of the switching element 20A is connected to the first electrode wiring line 15 on the first substrate 13. The electrode terminal 22 on the upper surface of the switching element 20A is connected to a fourth electrode wiring line 18 on the second substrate 14 with the spacer 30 interposed therebetween. The fourth electrode wiring line 18 is connected to a third electrode wiring line 17 on the first substrate 13 with a first via-spacer 31 interposed therebetween. The electrode terminal 21 on a lower surface of the switching element 20B is mounted on the third electrode wiring line 17 for connection. The electrode terminal 22 on the upper surface of the switching element 20B is connected to the second electrode wiring line 16 on the second substrate 14 with the spacer 30 interposed therebetween and is further connected to a fifth electrode wiring line 19 on the first substrate 13 with a second via-spacer 31 interposed therebetween.

External terminals P, N, and AC that are lead frames 40 for connection to an external circuit are attached on the first electrode wiring line 15, the fifth electrode wiring line 19, the third electrode wiring line 17, respectively.

In this manner, two switching elements, that is, the switching elements 20A and 20B are serially connected between the external terminals P and N, and the external terminal AC is a terminal connected to the electrode wiring line 17 between the two switching elements 20A and 20B. A DC voltage from the outside is applied between the external terminals P and N, and two switching elements, that is, the switching elements 20A and 20B, perform switching according to a control signal that is input from the outside. The control signal is input from a control signal terminal 41 mounted on the first substrate 13.

Types of the switching elements 20A and 20B include IGBT, MOSFET, and the like. In the case of IGBT, for individual input, control signal terminals 41 are mounted on a gate and an emitter, respectively, of each of the switching elements 20A and 20B. Further, the control signal terminal 41 and each of the switching elements 20A and 20B are connected to each other. According to an embodiment, in addition to the electrode terminal 22 on the upper surface of each of the switching elements 20A and 20B, connection terminals on the gate and emitter, which are individually installed on the upper surface of each of the switching elements 20A and 20B, and the control signal terminals 41 corresponding to the connection terminals, respectively, are connected with wires that are illustrated, through wire bonding.

The stack ceramic capacitor 11 is installed in the vicinity of at least one switching element 20A, and the connection terminal 12 on a first end of the stack ceramic capacitor 11 and the electrode terminal 21 on a lower surface of the switching element 20A are connected to each other with the first electrode wiring line 15 interposed therebetween. The connection terminal 12 on the second end of the stack ceramic capacitor 11 is connected to the second electrode wiring line 16 on the second substrate 14. The second electrode wiring line 16, as described above, is connected to the fifth electrode wiring line 19 on the first substrate 13 with the second via-spacer 31 interposed therebetween and is connected to the external terminal N. In this manner, the stack ceramic capacitor 11 is installed in a manner that is inserted in parallel with respect to the two switching elements 20A and 20B that are serially connected between the external terminals P and N, thereby constituting the snubber circuit.

FIGS. 4A to 4D illustrate the power module structure 1 using the connection structure 10 of the snubber circuit within the semiconductor device, which includes the single stack ceramic capacitor 11 as illustrated in FIG. 1. However, the power module structure 1 may use the connection structure 10 of the snubber circuit within the semiconductor device, in which the plurality of the ceramic capacitors 11 are configured to be installed in parallel or serially, as illustrate in FIG. 2 or 3.

In addition, as described above, in a case where a configuration in which the stack ceramic capacitor 11 is serially connected with a resistor being included in a bonding material is employed, as illustrated in FIGS. 4A to 4D, the stack ceramic capacitor 11 and the resistor may be connected as the RC snubber circuit. Two stack ceramic capacitors 11 and two resistors, as RC snubber circuits, may be connected with respect to two switching elements, that is, the switching elements 20A and 20B, respectively. That is, additionally, the stack ceramic capacitor 11 may be serially connected in the vicinity of the switching element 20B, with the resistor being included in a bonding material. In this case, the switching elements 20A and 20B share the electrode wiring line on the second substrate 14, as well as the electrode wiring line on the first substrate 13. The individual RC snubber circuits are connected in parallel to the switching elements 20A and 20B, respectively.

The power module structure 1 illustrated in FIG. 4A to 4C, as illustrated in FIG. 4D, is finally formed as a both-sided cooling-type power module 1 in which the first substrate 13 and the second substrate 14 and neighbors thereof are covered with molding resin 60 for protection and in which control signal terminals 41 protrude from the read frame 40. Heat-dissipation metal patterns 70 are formed on the lower surface of the first substrate 13 and on an upper surface of the second substrate 14, respectively, and are brought into contact with a heat sink or heat dissipator, such as an external heat-dissipation pin, for heat dissipation. The heat-dissipation metal patterns 70 are exposed through an upper surface and a lower surface, respectively, of the power module structure 1.

Figure 5:
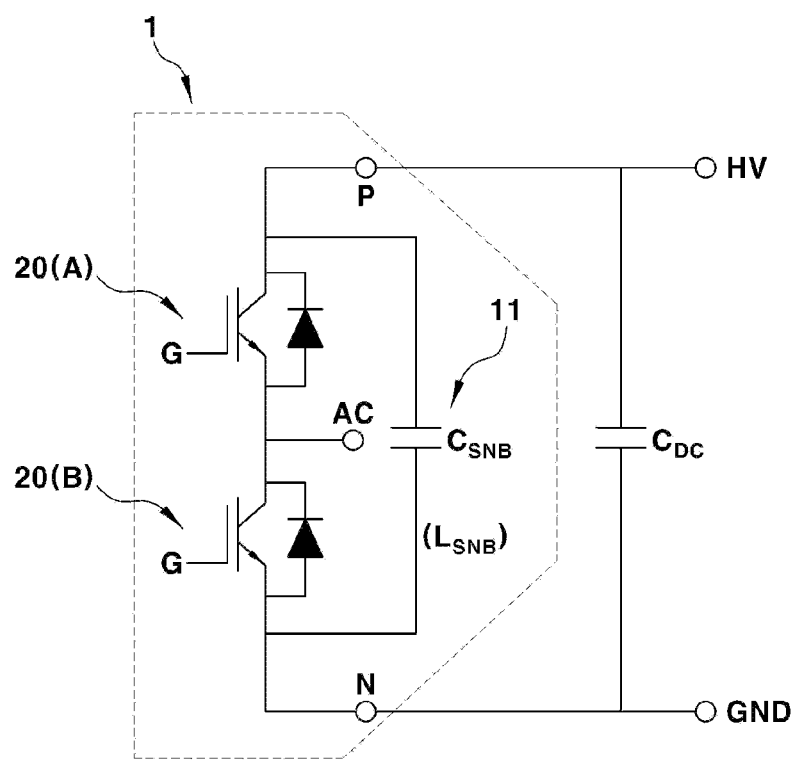
FIG. 5 is a view schematically illustrating an electric circuit corresponding to the power module structure in FIGS. 4A to 4D.

FIG. 5 is a view schematically illustrating an electric circuit corresponding to the power module structure in FIGS. 4A to 4D.

With reference to FIG. 5, a first end of the switching element 20A and a first end of the switching element 20B in the power module structure 1 in FIGS. 4A to 4D are serially connected, and a second end of the switching element 20A is connected to the external terminal P and the second end of the switching element 20A is connected to the external terminal N. In addition, a point of contact between the switching element 20A and the switching element 20B are connected to the external terminal AC.

The external terminal P is connected to a power terminal HV of a direct current power source, such as an external battery, and the external terminal N is connected to a ground terminal GND of the direct current power source. In addition, a smoothing capacitor CDC connecting the power terminal HV and the ground terminal GND of the direct current power source is connected in parallel to the power module structure 1.

A control signal from the outside is applied between the gate and the emitter of each of the two switching elements, that is, the switching elements 20A and 20B. Thus, the two switching elements, that is, the switching elements 20A and 20B perform a switching operation of controlling an output from the external terminal AC. When output current is abruptly changed as a result of the switching operation, a change in a power voltage occurs due to an influence of an induction coefficient. The smoothing capacitor CDC is installed to suppress this change. However, as illustrated in FIG. 5, the smoothing capacitor is installed outside of the power module structure 1. This exerts an influence on an induction coefficient of a wiring line path from the smoothing capacitor CDC to the switching elements 20A and 20B in the power module structure 1. Thus, the effect of the smoothing capacitor CDC cannot be sufficiently achieved.

In contrast, in the connection structure 10 of a snubber circuit within a semiconductor device according to the embodiment of the present disclosure, the stack ceramic capacitor 11 is installed in the vicinity of the switching elements 20A and 20B. Therefore, an induction coefficient of the wiring line path from the stack ceramic capacitor 11 to the switching elements 20A and 20B can be sufficiently decreased. Thus, it is possible to easily achieve an advantage of the stack ceramic capacitor 11 and to sufficiently reduce noise causing a change in electric power.

In this manner, in the connection structure 10 of a snubber circuit within a semiconductor device according to the embodiment of the present disclosure, the stack ceramic capacitor 11 is installed in the upright position, right in the vicinity of the switching element 20. With the connection structure 10, it is possible to provide the double-sided cooling-type power module structure 1 capable of greatly reducing noise, ensuring high connection reliability at a low cost, and being miniaturized.

Although the specific embodiment of the present disclosure has been described for illustrative purposes, those skilled in the art will appreciate that various modifications, additions and substitutions are possible, without departing from the scope and spirit of the disclosure as disclosed in the accompanying claims.

What is claimed is:

1. A connection structure of a snubber circuit within a semiconductor device, for use in a power module, the connection structure comprising:
   a first substrate having a first electrode wiring line provided on at least one surface of the first substrate;
   a second substrate facing the first substrate, the second substrate having a second electrode wiring line provided on at least one surface of the second substrate facing the first electrode wiring line; and
   a stack ceramic capacitor having first and second connection terminals provided on opposite ends in a longitudinal direction, respectively, of the stack ceramic capacitor that is installed in an upright position in such a manner that an entire surface of the first connection terminal on a first end thereof is connected to the first electrode wiring line and an entire surface of the second connection terminal on a second end thereof is connected to the second electrode wiring line,
   wherein a first conductive bonding material is interposed between the first connection terminal and the first electrode wiring line, and a second conductive bonding material is interposed between the second connection terminal and the second electrode wiring line, without providing a separate spacer for the stack ceramic capacitor, such that a distance between the first substrate and the second substrate is determined according to a dimension, in a longitudinal direction, of the stack ceramic capacitor,
   wherein the stack ceramic capacitor is installed adjacent to a switching element of the power module, the switching element being attached on the first substrate, and
   wherein the first connection terminal and one electrode terminal on the switching element are connected to each other, and the first electrode wiring line is interposed therebetween.

2. The connection structure of claim 1, wherein the stack ceramic capacitor comprises a plurality of stack ceramic capacitors installed in the upright position and connected in parallel to each other between the first electrode wiring line and the second electrode wiring line.

3. The connection structure of claim 1, wherein the stack ceramic capacitor comprises a plurality of stack ceramic capacitors installed in the upright position between the first substrate and the second substrate in such a manner that a plurality of structures in which the stack ceramic capacitors are connected in parallel to each other are serially connected to each other.

4. A power module structure, comprising:
   a first substrate having a first electrode wiring line provided on at least one surface of the first substrate;
   a second substrate facing the first substrate, the second substrate having at least a second electrode wiring line provided on at least one surface of the second substrate facing the first electrode wiring line;

at least one switching element mounted on the first substrate;

a spacer inserted between an electrode terminal on an upper surface of the at least one switching element and the second substrate and configured to electrically connect the electrode terminal on the upper surface thereof and the second electrode wiring line on the second substrate or another electrode wiring line on the second substrate to each other; and a stack ceramic capacitor having first and second connection terminals provided on opposite ends in a longitudinal direction, respectively, of the stack ceramic capacitor that is installed in an upright position in such a manner that an entire surface of the first connection terminal on a first end thereof is connected to the first electrode wiring line and an entire surface of the second connection terminal on a second end thereof is connected to the second electrode wiring line, wherein a first conductive bonding material is interposed between the first connection terminal and the first electrode wiring line, and a second conductive bonding material is interposed between the second connection terminal and the second electrode wiring line, without providing a separate spacer for the stack ceramic capacitor, such that a distance between the first substrate and the second substrate is determined according to a dimension, in a longitudinal direction, of the stack ceramic capacitor, wherein the stack ceramic capacitor is installed adjacent to the at least one switching element and configured as a snubber circuit in which the first connection terminal and an electrode terminal on a lower surface of the switching element are connected to each other, and the first electrode wiring line is interposed therebetween.

* * * * *